(12) United States Patent
Chuang et al.

(10) Patent No.: US 11,545,468 B2
(45) Date of Patent: Jan. 3, 2023

(54) WAFER STACKING METHOD AND WAFER STACKING STRUCTURE

(71) Applicant: Changxin Memory Technologies, Inc., Anhui (CN)

(72) Inventors: Ling-Yi Chuang, Hefei (CN); Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 22 days.

(21) Appl. No.: 17/202,248

(22) Filed: Mar. 15, 2021

(65) Prior Publication Data
US 2021/0202448 A1 Jul. 1, 2021

Related U.S. Application Data

(63) Continuation of application No. PCT/CN2019/110174, filed on Oct. 9, 2019.

(30) Foreign Application Priority Data

Nov. 1, 2018 (CN) .......................... 201811294776.3
Nov. 1, 2018 (CN) .......................... 201821792445.8

(51) Int. Cl.
*H01L 21/768* (2006.01)
*H01L 25/065* (2006.01)
(Continued)

(52) U.S. Cl.
CPC .... *H01L 25/0657* (2013.01); *H01L 21/76898* (2013.01); *H01L 21/78* (2013.01);
(Continued)

(58) Field of Classification Search
CPC ........... H01L 25/0657; H01L 21/76898; H01L 21/78; H01L 23/481; H01L 23/544
See application file for complete search history.

(56) References Cited

U.S. PATENT DOCUMENTS

| 2014/0252626 A1 | 9/2014 | Kang et al. |
| 2016/0071816 A1 | 3/2016 | Huang et al. |

(Continued)

FOREIGN PATENT DOCUMENTS

| CN | 107275323 A | 10/2017 |
| CN | 108346588 A | 7/2018 |
| CN | 208954984 U | 6/2019 |

OTHER PUBLICATIONS

PCT International Search Report and the Written Opinion dated Jan. 7, 2020, issued in related International Application No. PCT/CN2019/110174 (8 pages).

*Primary Examiner* — Thao P Le
(74) *Attorney, Agent, or Firm* — Sheppard Mullin Richter & Hampton LLP

(57) ABSTRACT

A wafer stacking method and structure are provided. The wafer stacking method includes: providing a first wafer, wherein an upper surface of the first wafer includes a first bonding pad configured to connect to a first signal; fabricating a first redistribution layer (RDL) on the first wafer, comprising a first wiring electrically connected to the first bonding pad, and the first wiring includes a first landing pad; bonding a second wafer on the first RDL, wherein the second wafer includes a second bonding pad configured to connect the first signal and located corresponding to the first bonding pad; fabricating a first through silicon via (TSV) with a bottom connected to the first landing pad at a position corresponding to the first landing pad; and fabricating a second RDL on the second wafer to connect the second bonding pad and the first TSV. This wafer stacking method improves the manufacturing yield.

20 Claims, 10 Drawing Sheets

(51) Int. Cl.
   *H01L 21/78*    (2006.01)
   *H01L 23/48*    (2006.01)
   *H01L 23/544*   (2006.01)
   *H01L 25/00*    (2006.01)

(52) U.S. Cl.
   CPC .......... *H01L 23/481* (2013.01); *H01L 23/544* (2013.01); *H01L 25/50* (2013.01); *H01L 2223/5446* (2013.01); *H01L 2225/06541* (2013.01)

(56) References Cited

U.S. PATENT DOCUMENTS

| | | | |
|---|---|---|---|
| 2019/0115316 A1 | 4/2019 | Liu | |
| 2021/0074644 A1* | 3/2021 | Chuang | H01L 25/50 |
| 2021/0202563 A1* | 7/2021 | Kim | H01L 27/14634 |
| 2021/0375768 A1* | 12/2021 | Tsou | H01L 23/49838 |
| 2021/0391376 A1* | 12/2021 | Chen | H01L 23/5384 |
| 2022/0130761 A1* | 4/2022 | Kim | H01L 23/5286 |
| 2022/0246484 A1* | 8/2022 | Yokoi | H01L 23/5226 |

\* cited by examiner

100

```
┌─────────────────────────────────────────────────────────┐
│ provide a first wafer, wherein an upper surface of the  │──── S102
│ first wafer includes a first bonding pad disposed to    │
│ connect to a first signal                               │
└─────────────────────────────────────────────────────────┘
                             │
                             ▼
┌─────────────────────────────────────────────────────────┐
│ fabricate a first RDL on the first wafer, wherein the   │──── S104
│ first RDL includes a first distribution electrically    │
│ connected to the first bonding pad, and the first       │
│ distribution includes a first landing end located on    │
│ an upper surface of the first RDL                       │
└─────────────────────────────────────────────────────────┘
                             │
                             ▼
┌─────────────────────────────────────────────────────────┐
│ bond a second wafer on the first RDL, wherein the       │──── S106
│ second wafer includes a second bonding pad configured   │
│ to connect to the first signal and located              │
│ corresponding to the first bonding pad                  │
└─────────────────────────────────────────────────────────┘
                             │
                             ▼
┌─────────────────────────────────────────────────────────┐
│ fabricate a first TSV with a bottom connected to the    │──── S108
│ first landing pad at a position of the second wafer     │
│ corresponding to the first landing pad                  │
└─────────────────────────────────────────────────────────┘
                             │
                             ▼
┌─────────────────────────────────────────────────────────┐
│ fabricate a second RDL on the second wafer to connect   │──── S110
│ the second bonding pad and the first TSV and form a     │
│ second landing pad                                      │
└─────────────────────────────────────────────────────────┘
```

FIG. 2

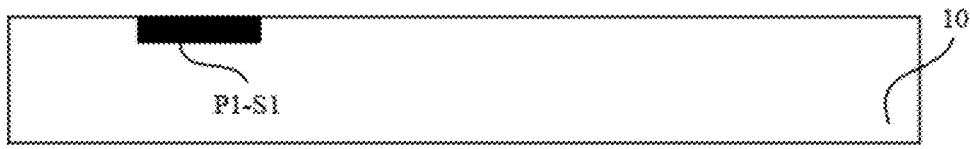

FIG. 3A

WAFER STACKING METHOD AND WAFER STACKING STRUCTURE

CROSS-REFERENCE TO RELATED APPLICATIONS

This application is a continuation application of International Patent Application No. PCT/CN2019/110174, filed on Oct. 9, 2019, which is based on and claims priority of the Chinese Patent Application Nos. 201811294776.3, and No. 201821792445.8, both filed on Nov. 1, 2018. The above-referenced applications are incorporated herein by reference in their entirety.

TECHNICAL FIELD

The present invention relates generally to the technical field of integrated circuit (IC) manufacturing, and more specifically, to a wafer stacking method capable of improving electrical connections between dies and a wafer stacking structure fabricated by using the wafer stacking method, and a die stacking structure.

BACKGROUND

In an IC manufacturing process, by stacking multiple dies and establishing mechanical and electrical connection thereon, the size of an IC may be reduced. As shown in FIGS. 1A and 1B, in existing practices, a through silicon via (TSV) may first be fabricated for each to-be-stacked die, then a micro bump may be formed for each TSV. Last, the dies may be bonded together through die-to-die or die-to-wafer bonding, and inter-layer electrical connections may be established through the micro bumps and TSV.

The die-to-die or die-to-wafer bonding process, however, has a low efficiency, which drives up the cost. Additionally, the TSV and the micro bumps needs to be fabricated for each die in advance, and the risks associated with a positioning or a connection error in the bonding process are substantial. The electrical connection path between dies located on different layers may be easily disrupted. All of these may reduce the production yield.

Therefore, a die stacking method that can overcome the aforementioned issues is desired.

It is to be noted that the information disclosed in the above background is merely for strengthening the understanding on the background of the present invention and thus may include information that does not constitute prior art known to a person of ordinary skill in the art.

SUMMARY

In view of the limitations of existing technologies described above, the present invention provides a wafer stacking method and a wafer stacking structure, which address the aforementioned issues in existing technologies, including high die stacking cost, susceptibility to connection error, and low production yield.

One aspect of the present invention is directed to a wafer stacking method. The method may include: providing a first wafer, wherein an upper surface of the first wafer may include a first bonding pad configured to connect to a first signal; fabricating a first redistribution layer (RDL) on the first wafer, wherein the first RDL may include a first wiring electrically connected to the first bonding pad, and the first wiring may include a first landing pad; bonding a second wafer on the first RDL, wherein the second wafer may include a second bonding pad configured to connect to the first signal and located corresponding to the first bonding pad; fabricating a first through silicon via (TSV) with a bottom connected to the first landing pad at a position of the second wafer corresponding to the first landing pad; and fabricating a second RDL on the second wafer to connect the second bonding pad and the first TSV, and to form a second landing pad.

In some embodiments of the present invention, a distance between the first landing pad and the first bonding pad in a horizontal direction may be larger than zero.

In some embodiments of the present invention, fabricating a first TSV with a bottom connected to the first landing pad may include: fabricating a through via at the position of the second wafer corresponding to the first landing pad, wherein a bottom of the through via may expose the first landing pad; and filling a conductive material into the through via, wherein the conductive material may include a metal.

In some embodiments of the present invention, the aforementioned method may further include fabricating a groove configured to form the second RDL while fabricating the through via.

Another aspect of the present invention is directed to a wafer stacking structure. The structure may include: a first wafer, having an upper surface including a first bonding pad configured to connect to a first signal; a first RDL, located on the first wafer and including a first wiring electrically connected to the first bonding pad, with the first wiring including a first landing pad; a second wafer, having a bottom bonded on the first RDL, and an upper surface including a second bonding pad configured to connect to the first signal and located corresponding to the first bonding pad, and a first TSV with a bottom electrically connected to the first landing pad; and a second RDL, located on the second wafer, and including a second wiring electrically connected to the first TSV and the second bonding pad. The second wiring may include a second landing pad.

In some embodiments of the present invention, a distance between the first landing pad and the first bonding pad in a horizontal direction may be larger than zero.

In some embodiments of the present invention, the fabrication of the first TSV may be after the bonding of the first wafer with the first RDL.

Another aspect of the present invention is directed to a die stacking method. The method may include: providing the wafer stacking structure according to any one of the aforementioned embodiments; and scribing and cutting the wafer stacking structure to form a preset number of dies.

Another aspect of the present invention is directed to a die stacking structure. The structure may include: a first die, having an upper surface including a first bonding pad configured to connect to a first signal; a first RDL, located on the first die and including a first wiring electrically connected to the first bonding pad, with the first wiring including a first landing pad; a second die, having a bottom bonded on the first RDL, and an upper surface including a second bonding pad configured to connect to the first signal and located corresponding to the first bonding pad, and a first TSV with a bottom electrically connected to the first landing pad; and a second RDL, located on the second die, and including a second wiring electrically connected to the first TSV and the second bonding pad. The second wiring may include a second landing pad.

In some embodiments of the present invention, a distance between the first landing pad and the first bonding pad in a horizontal direction may be larger than zero.

In some embodiments of the present invention, the fabrication of the first TSV may be after the bonding of the first die with the first RDL.

Another aspect of the present invention is directed to a wafer stacking method. The method may include: providing a first wafer, wherein the first wafer may include a first bonding pad configured to connect a first signal; sequentially fabricating a first lower RDL and a first upper RDL on the first wafer, wherein the first lower RDL may include a first wiring electrically connected to the first bonding pad, the first upper RDL may include a second wiring electrically connected to the first wiring, and the second wiring may include a first landing pad; bonding a second wafer on the first upper RDL, wherein the second wafer may include a second bonding pad configured to connect the first signal and located corresponding to the first bonding pad; fabricating a first TSV with a bottom connected to the first landing pad at a position of the second wafer corresponding to the first landing pad; and fabricating two RDLs on the second wafer to connect the second bonding pad and the first TSV, and form a second landing pad.

In some embodiments of the present invention, a distance between the first landing pad and the first bonding pad in a horizontal direction may be larger than zero.

In some embodiments of the present invention, fabricating a first TSV with a bottom connected to the first landing pad may include: fabricating a through via at the position of the second wafer corresponding to the first landing pad, wherein a bottom of the through via may expose the first landing pad; and filling a conductive material into the through via, wherein the conductive material may include a metal.

In some embodiments of the present invention, the aforementioned method may further include: fabricating a groove configured to form a second lower RDL while fabricating the through via.

In some embodiments of the present invention, fabricating two RDLs on the second wafer to connect the second bonding pad and the first TSV, and form a second landing pad includes: fabricating a second lower RDL on the second wafer, wherein the second lower RDL may include a third wiring electrically connected to the first TSV and the second bonding pad; and fabricating a second upper RDL on the second lower RDL, wherein the second upper RDL may include a fourth wiring electrically connected to the third wiring, and the fourth wiring may include the second landing pad.

Another aspect of the present invention is directed to a wafer stacking structure. The structure may include: a first wafer, having an upper surface including a first bonding pad configured to connect to a first signal; a first lower RDL, located on the first wafer and including a first wiring electrically connected to the first bonding pad; a first upper RDL, located on the first lower RDL and including a second wiring electrically connected to the first wiring, with the second wiring including a first landing pad; a second wafer, having a bottom bonded on the first upper RDL, and an upper surface provided with a second bonding pad connecting to the first signal and located corresponding to the first bonding pad, and a first TSV with a bottom electrically connected to the first landing pad; a second lower RDL, located on the second wafer, and including a third wiring electrically connected to the second bonding pad and the first TSV; and a second upper RDL, located on the second lower RDL, and including a fourth wiring electrically connected to the third wiring. The fourth wiring may include a second landing pad.

In some embodiments of the present invention, a distance between the first landing pad and the first bonding pad in a horizontal direction may be larger than zero.

In embodiments of the present invention, the fabrication of the first TSV may be after the bonding of the first wafer with the first upper RDL.

Another aspect of the present invention is directed to a die stacking method. The method may include: providing the wafer stacking structure of any one of the aforementioned embodiments; and scribing and cutting the wafer stacking structure to form a preset number of dies.

Another aspect of the present invention is directed to a die stacking structure. The structure may include: a first die, having an upper surface including a first bonding pad configured to connect a first signal; a first lower RDL, located on the first die and including a first wiring electrically connected to the first bonding pad; a first upper RDL, located on the first lower RDL and including a second wiring electrically connected to the first wiring, with the second wiring including a first landing pad; a second die, having a bottom bonded on the first upper RDL, and an upper surface provided with a second bonding pad connecting the first signal and located corresponding to the first bonding pad and a first TSV with a bottom electrically connected to the first landing pad; a second lower RDL, located on the second die, and including a third wiring electrically connected to the second bonding pad and the first TSV; and a second upper RDL, located on the second lower RDL, and including a fourth wiring electrically connected to the third wiring. The fourth wiring may include a second landing pad.

In some embodiments of the present invention, a distance between the first landing pad and the first bonding pad in a horizontal direction may be larger than zero.

In some embodiments of the present invention, the fabrication of the first TSV may be after the bonding of the first die with the first upper RDL.

Another aspect of the present invention is directed to a die stacking structure. The structure may include: a plurality of die structures stacked over one another. Each of the plurality of die structures may comprise: a die, having an upper surface comprising a bonding pad configured to connected to a signal; a lower redistribution layer (RDL), located on the die and comprising a first wiring electrically connected to the bonding pad; and an upper RDL, located on the lower RDL and comprising a second wiring electrically connected to the first wiring, the second wiring having a landing pad.

In each of the plurality of die structures except for the bottom most die structure, the die may be bonded to the upper RDL of the die structure underneath, and may comprise a through silicon via (TSV) with a bottom electrically connected to the landing pad of the die structure underneath. The first wiring in the lower RDL may be electrically connected to the TSV. Bonding pads of the plurality of die structures may be located on corresponding locations. The signals in the die of each of the plurality of die structures may be guided out to the landing pad of the uppermost die structure through the TSVs in the plurality of die structures.

According to the wafer stacking method and the wafer stacking structure provided by the embodiments of the present invention, wafers are first bonded together before TSVs are formed, and the signal connection between bonding pads having a same signal at same positions of the wafers is established using one or two RDLs. Thus, the error related to mechanical alignment and electrical connection of the TSV in the related art may be prevented. The connection for signals of the bonding pads located at same positions on different wafer layers may be established through mechanical connections between the wafers, and a micro bump is unnecessary, so the adversarial effect of a micro bump on the production yield may be eliminated. Therefore, the manufacturing cost of a die having a stacking structure may be lowered, and the production yield may be improved.

It is to be understood that both the foregoing general description and the following detailed description are exemplary and explanatory only and are not necessarily restrictive to the present invention.

BRIEF DESCRIPTION OF THE DRAWINGS

The accompanying drawings, which are incorporated in and constitute a part of the specification, illustrate embodiments of the present invention and together with the specification, serve to explain the principles of the present invention. Apparently, the accompanying drawings in the following description are only some embodiments of the present invention, and a person of ordinary skill in the art can derive other drawings from the accompanying drawings without creative efforts.

FIG. 2 shows a flowchart illustrating a wafer stacking method in accordance with one embodiment of the present invention.

FIGS. 3A, 3B, 3C, 3D, and 3E show schematic diagrams of wafer stacking structures formed by a wafer stacking method in accordance with one or more embodiments of the present invention.

DETAIL DESCRIPTION OF THE EMBODIMENTS

Figure 1A:
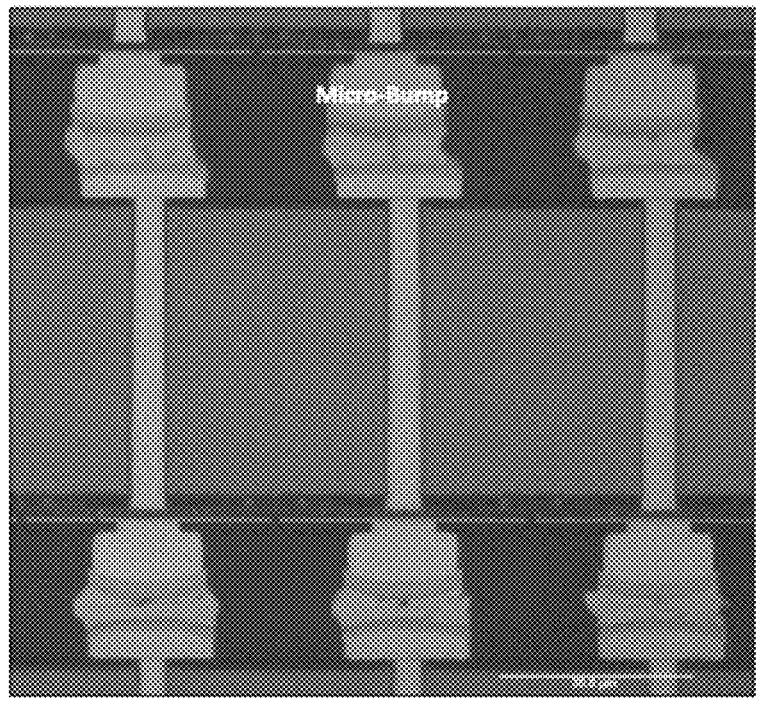
FIGS. 1A and 1B show schematic diagrams of a die stacking structure in the related art.

The exemplary embodiments will be described more completely in conjunction with the accompanying drawings. However, the exemplary embodiments can be implemented in various forms, and should not be understood as being limited to the embodiments described herein. Instead, these embodiments are provided to make the present invention thorough and complete and convey the concepts of the exemplary embodiments to a person skilled in the art fully.

The described characteristics, structures or properties may be combined in one or more embodiment in any appropriate manner. In the following description, many particular details are provided to give a full understanding on the embodiments of the present invention. However, it would be appreciated by the person skilled in the art that one or more of the particular details may be omitted by the practice of the technical solutions of the present invention, or other methods, components, apparatuses, steps and the like may be adopted. In other cases, the known technical solutions are not illustrated or described in detail to prevent distracting and making aspects of the present invention obscure.

Additionally, the accompanying drawings are merely schematic diagrams of the present invention. In the accompanying drawings, identical reference signs represent identical or similar parts, and therefore, the descriptions thereof are omitted. Some block diagrams in the accompanying drawings are functional entities, which do not necessarily correspond to physically or logically independent entities. These functional entities may be implemented in a software form, or implemented in one or more hardware modules or integrated circuits, or implemented in different networks and/or processor apparatuses and/or microcontroller apparatuses.

The embodiments of the present invention will be described below in detail with reference to the accompanying drawings.

FIG. 2 shows a flowchart illustrating a wafer stacking method in accordance with one embodiment of the present invention. Referring to FIG. 2, the wafer stacking method 100 may include the following steps S102 through S110.

In step S102, a first wafer may be provided. An upper surface of the first wafer may include a first bonding pad configured to connect to a first signal.

In step S104, a first RDL may be fabricated on the first wafer. The first RDL may include a first wiring electrically connected to the first bonding pad, and the first wiring may include a first landing pad.

In step S106, a second wafer may be bonded on the first RDL. The second wafer may include a second bonding pad configured to connect to the first signal and located corresponding to the first bonding pad.

In step S108, a first TSV with a bottom connected to the first landing pad may be fabricated at a position of the second wafer corresponding to the first landing pad.

In step S110, a second RDL may be fabricated on the second wafer to connect the second bonding pad and the first TSV, and form a second landing pad.

FIGS. 3A, 3B, 3C, 3D, and 3E show schematic diagrams of wafer stacking structures formed by a wafer stacking method shown in FIG. 2.

FIG. 3A shows a first wafer 10 provided in the step S102. An upper surface of the first wafer 10 may include a first bonding pad P1-S1 configured to connect to a first signal S1.

Figure 3B:
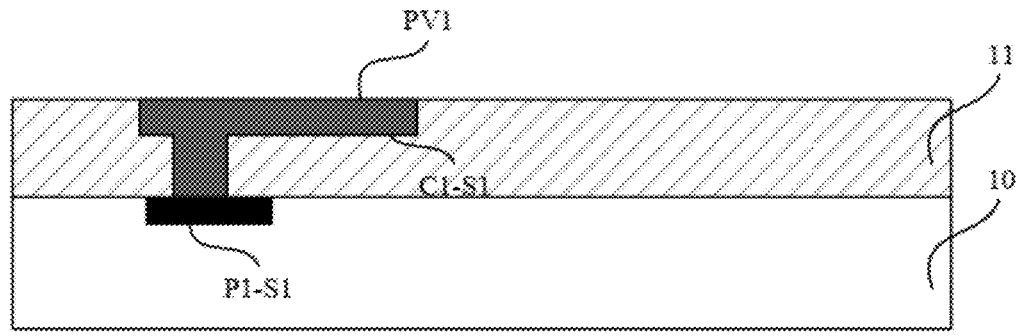

FIG. 3B shows a fabrication process of a first RDL 11 on the first wafer 10 in step S104. The first RDL 11 may be provided with a first wiring C1-S1, and a first landing pad PV1 on an upper surface of the first RDL 11. The first wiring C1-S1 may be a metal structure, such as a copper structure.

Although FIGS. 3A, 3B, 3C, 3D, and 3E illustrate an embodiment in which a first wafer 10 does not include a TSV, it may be understood that the first wafer 10 in other embodiments may also include a TSV electrically connected to the first signal, and correspondingly, the first wiring may be connected to the TSV.

In the embodiment shown in FIG. 3B, a distance between the first landing pad PV1 and the first bonding pad P1-S1 in a horizontal direction may be denoted as L1, and L1≠0. The person skilled in the art may set directions for relative positions of the first landing pad PV1 and the first bonding pad P1-S1 at discretion.

Figure 3C:
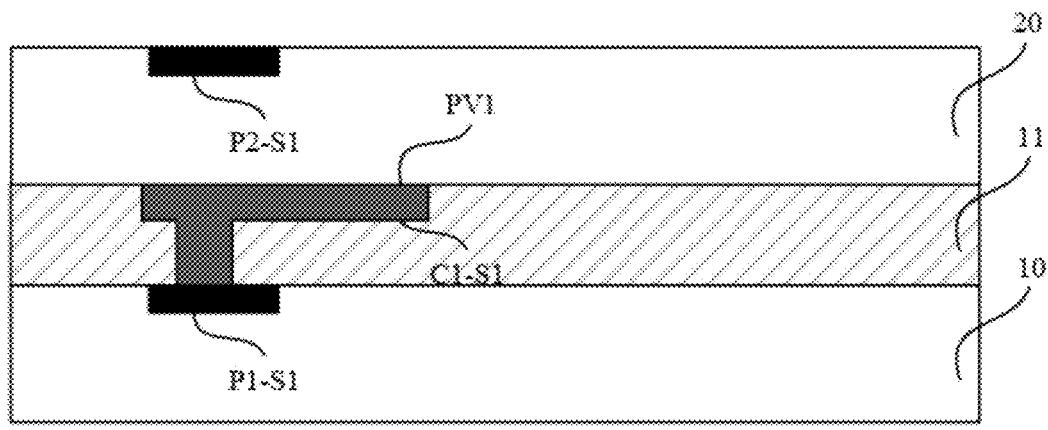

FIG. 3C shows a schematic diagram of bonding a second wafer 20 on the first RDL 11 in step S106. An upper surface of the second wafer 20 may include a second bonding pad P2-S1 configured to connect to the first signal S1.

It may be understood by the person skilled in the art that the bonding process may include the steps of first performing chemical mechanical polishing (CMP) on an upper surface of the first RDL 11, then using a plasma to activate the surface of the first RDL 11, and at last bonding the second wafer 20 on the activated surface, which will not be repeated thereto.

In the embodiment shown in FIG. 3C, a structure for isolating the first wiring C1-S1 and the second wafer 20 may be provided between the second wafer 20 and the first RDL 11. For example, the isolation between the first wiring C1-S1 and the second wafer 20 may be implemented by growing an oxidation layer or other insulation layers on the upper surface of the first RDL 11. Alternatively, in other embodiments, the first wiring C1-S1 may be manufactured to be lower than the upper surface of the first RDL 11 in manufacturing. That may be made by, for example, fabricating the first wiring C1-S1 with a damascene process, and followed by depositing a medium material of the first RDL 11 on the first wiring C1-S1, so that the first wiring C1-S1 is covered by the medium material and only the first landing pad PV1 is exposed. In some embodiments, a bottom of the second wafer 20 may be insulated in advance. Various methods may be used to implement inter-layer insulation, a specific method used in an application may be determined according to an actual requirement, and this invention is not limited herein.

Figure 3D:
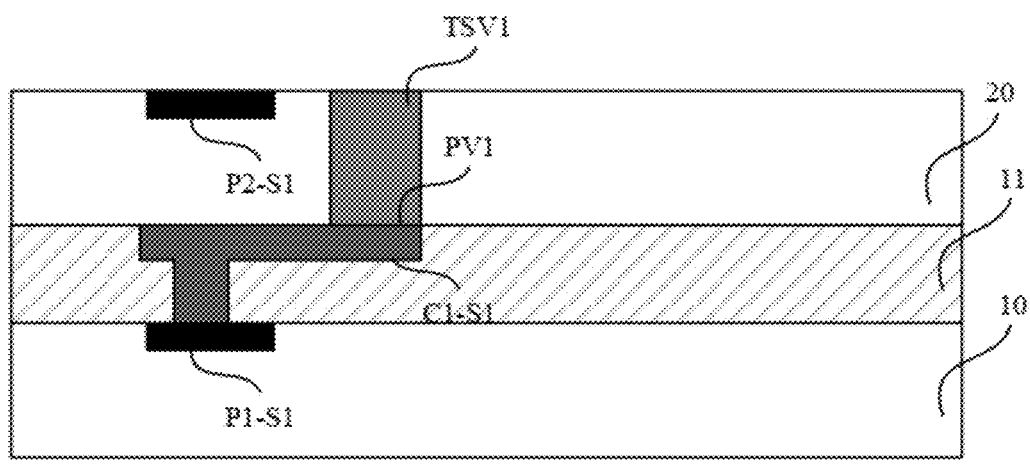

FIG. 3D is a schematic diagram of step S108. A first TSV TSV1 may be fabricated at a position of the second wafer 20 corresponding to the first landing pad PV1, and the first TSV TSV1 may be filled.

In some embodiments, step S106 may include the following steps: fabricating a through via at the position of the second wafer corresponding to the first landing pad, with a bottom of the through via exposing the first landing pad; and filling a conductive material into the through via. The conductive material may include a metal.

Figure 3E:
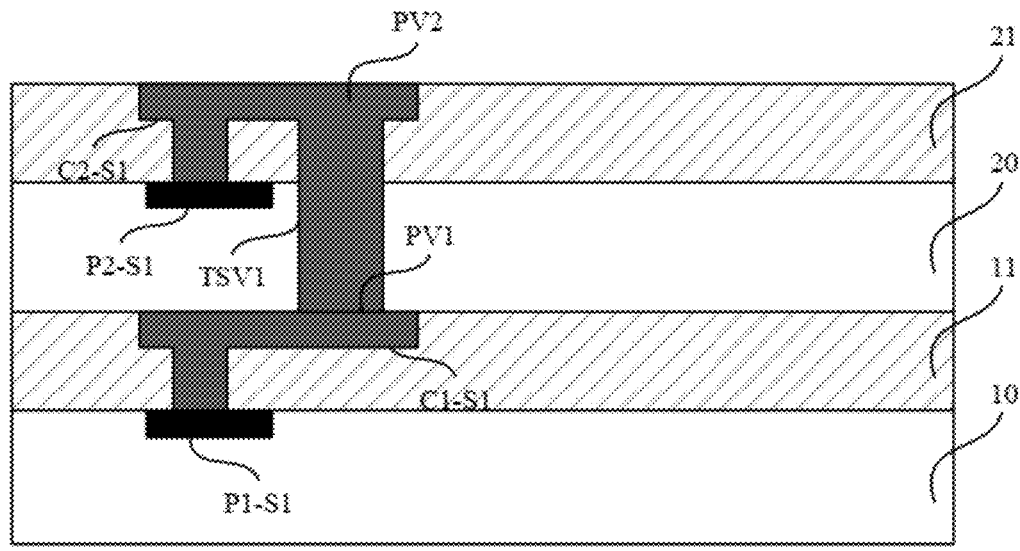

FIG. 3E is a schematic diagram of step S110. A first medium material may be deposited on the second wafer 20, and a second wiring C2-S1 connected to the second bonding pad P2-S1 and the first TSV TSV1 may be fabricated to form the second RDL 21.

As a result, the first bonding pad P1-S1 may be in connection with the second bonding pad P2-S1 via the first TSV TSV1, the first wiring C1-S1, and the second wiring C2-S1. The electrical connection between the bonding pads may be implemented without a micro bump, and common problems in the die stacking process in the related art, such as material leakage, pseudo soldering and misalignment may be prevented.

Figure 1B:
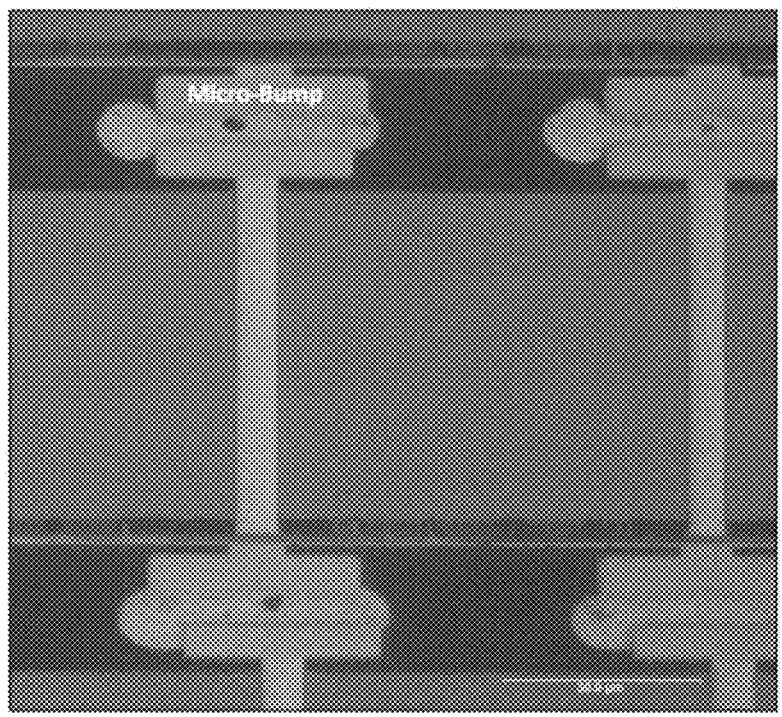
Figure 4:
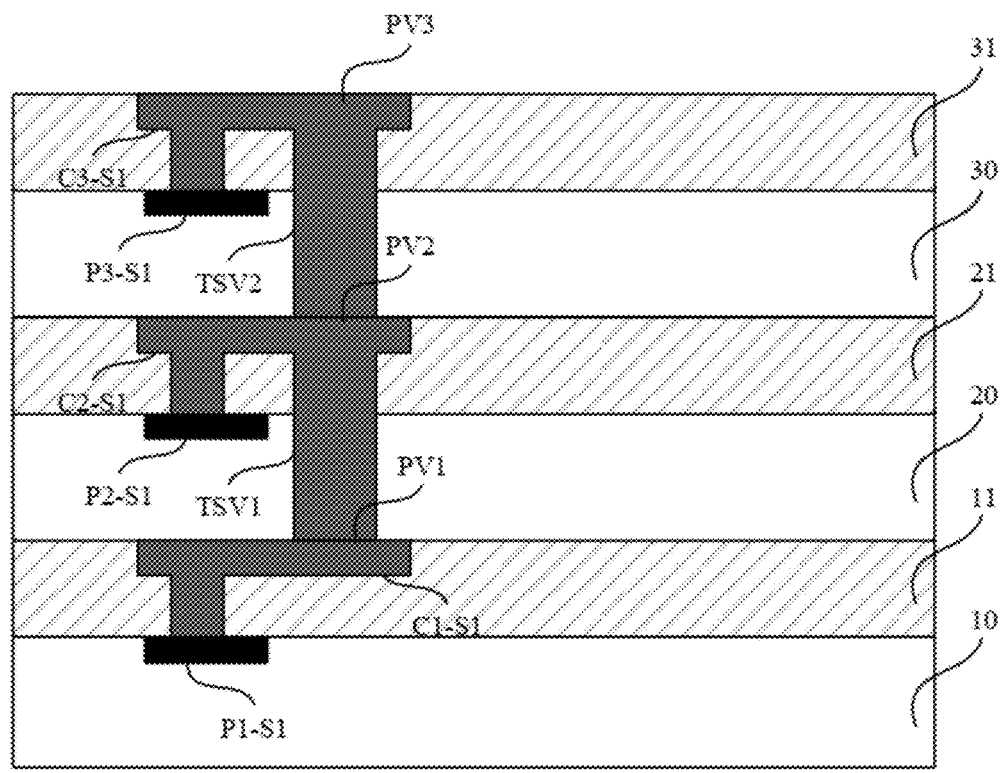
FIG. 4 shows a schematic diagram illustrating a wafer stacking structure in accordance with one embodiment of the present invention.

By virtue of repetitive operation made with reference to the steps shown in FIG. 1, the stacking for multiple layers of wafers and the connection between bonding pads having a same position for a same connection signal on different layers of wafers may be implemented via only one RDL, as shown in FIG. 4. Therefore, common problems in the electrical connection process of the wafer stacking process in the related art, such as material leakage, pseudo soldering and misalignment may be prevented, and the yield is improved.

Figure 5:
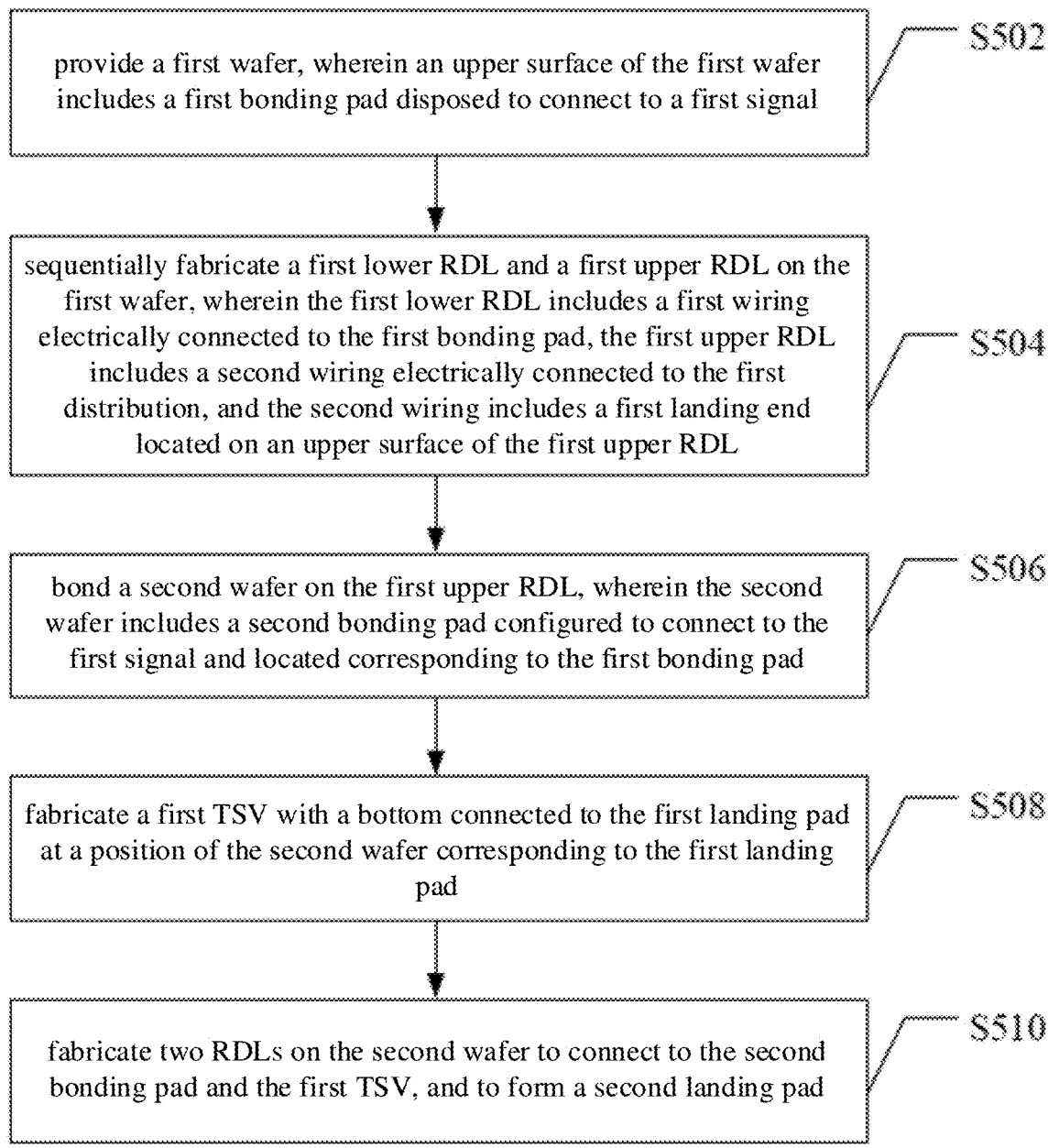
FIG. 5 shows a flowchart illustrating a wafer stacking method in accordance with one embodiment of the present invention.

FIG. 5 shows a flowchart illustrating a wafer stacking method in accordance with one embodiment of the present invention.

Referring to FIG. 5, the wafer stacking method 500 may include the following steps S502 through S510.

In step S502, a first wafer may be provided. The first wafer may include a first bonding pad configured to connect to a first signal.

In step S504, a first lower RDL and a first upper RDL may be sequentially fabricated on the first wafer. The first lower RDL may include a first wiring electrically connected to the first bonding pad, the first upper RDL may include a second wiring electrically connected to the first wiring, and the second wiring may include a first landing pad.

In step S506, a second wafer may be bonded on the first upper RDL. The second wafer may include a second bonding pad configured to connect to the first signal and having a position corresponding to the first bonding pad.

In step S508, a first TSV with a bottom connected to the first landing pad may be fabricated at a position of the second wafer corresponding to the first landing pad.

In step S510, two RDLs may be fabricated on the second wafer to connect the second bonding pad and the first TSV, and to form a second landing pad.

FIGS. 6A, 6B, 6C, 6D, and 6E show schematic diagrams of wafer stacking structures fabricated with a wafer stacking method shown in FIG. 5.

Figure 6A:
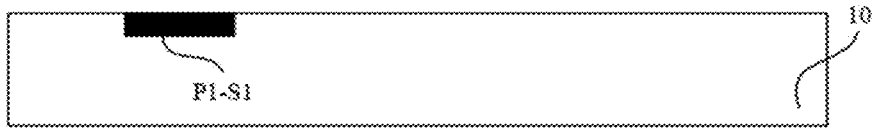
FIGS. 6A, 6B, 6C, 6D, 6E, and 6F show schematic diagrams of wafer stacking structures formed by a wafer stacking method shown in FIG. 5.

FIG. 6A shows a first wafer 10 provided in step S502. An upper surface of the first wafer 10 may include a first bonding pad P1-S1 configured to connect to a first signal S1.

Figure 6B:
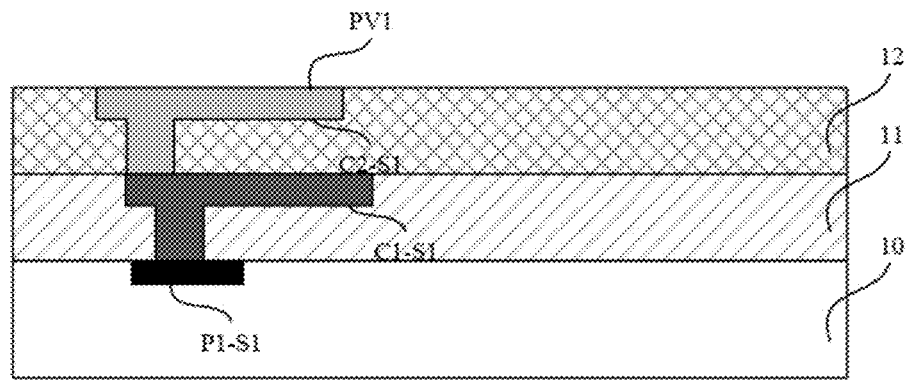

FIG. 6B shows a schematic diagram of sequentially fabricating a first lower RDL 11 and a first upper RDL 12 on the first wafer 10 in step S504. The first lower RDL 11 may include a first wiring C1-S1 electrically connected to the first bonding pad P1-S1, the first upper RDL 12 may include a second wiring C2-S1 electrically connected to the first wiring C1-S1, and the second wiring C2-S1 may include a first landing pad PV1. The first wiring C1-S1 and the second wiring C2-S1 may each be, for example, a metal structure.

Although FIGS. 6A, 6B, 6C, 6D, and 6E illustrate an embodiment in which a first wafer 10 does not include a TSV, it may be understood that the first wafer 10 in other embodiments may include the TSV electrically connected to the first signal, and correspondingly, the first lower RDL 11 and the first upper RDL 12 may include a wiring connected to the first signal.

In the embodiment shown in FIG. 6B, a distance between the first landing pad PV1 and the first bonding pad P1-S1 in a horizontal direction may be L1, and L1≠0. Relative positions and directions of the first landing pad PV1 and the first bonding pad P1-S1 may be determined according to specific requirements, and this invention is not limited in this regard.

Figure 6C:
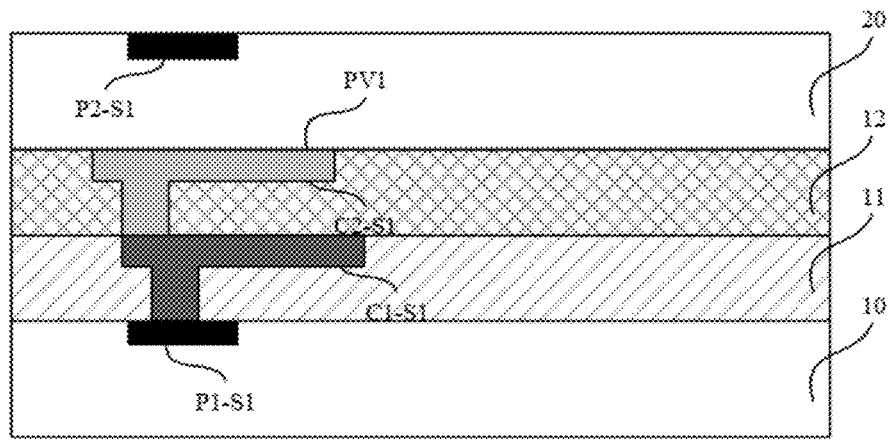

FIG. 6C shows a schematic diagram of bonding a second wafer 20 on the first upper RDL 12 in step S506. An upper surface of the second wafer 10 may include a second bonding pad P2-S1 configured to connect to the first signal S1.

It may be understood by the person skilled in the art that the bonding process may include the steps of first performing CMP on an upper surface of the first upper RDL 12, then using a plasma to activate the surface of the first upper RDL 12, and at last bonding the second wafer 20 on the activated surface. Detail implementation of these processes will not be described herein for the sake of conciseness.

In the embodiment shown in FIG. 6C, a structure for isolating the second wiring C2-S1 and the second wafer 20 may be provided between the second wafer 20 and the first upper RDL 12. For example, the isolation between the second wiring C2-S1 and the second wafer 20 may be implemented by growing an oxidation layer or other insulation layers on the upper surface of the first upper RDL 12. In other embodiments, the second wiring C2-S1 may be manufactured to be lower than the upper surface of the first upper RDL 12 during manufacturing. That may be made by, for example, fabricating the second wiring C2-S1 with a damascene process, followed by depositing a medium material of the first upper RDL 12 on the second wiring C2-S1, so that the second wiring C2-S1 is covered by the medium material with only the first landing pad PV1 exposed. In some embodiments, the second wafer 20 or a bottom part of the second wafer 20 may be insulated in advance. Various methods may be used to implement inter-layer insulation, a specific method used in an application may be determined according to an actual requirement, and this invention is not limited herein.

Figure 6D:
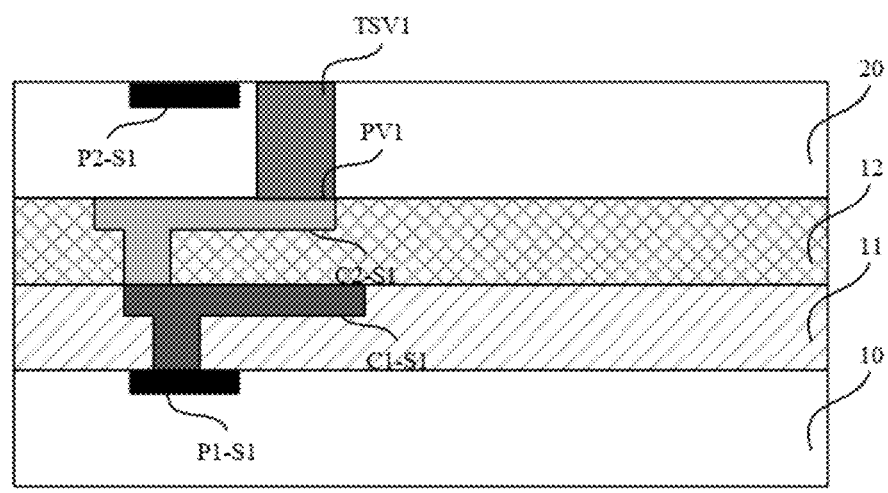

FIG. 6D shows a schematic diagram of step S508. A first TSV TSV1 may be fabricated at a position of the second wafer 20 corresponding to the first landing pad PV1, and the first TSV TSV1 may be filled. In some embodiments, step S506 may include the following steps: fabricating a through via at the position of the second wafer corresponding to the first landing pad, with a bottom of the through via connected to the first landing pad; and filling a conductive material into the through via. The conductive material may include a metal.

Figure 6E:
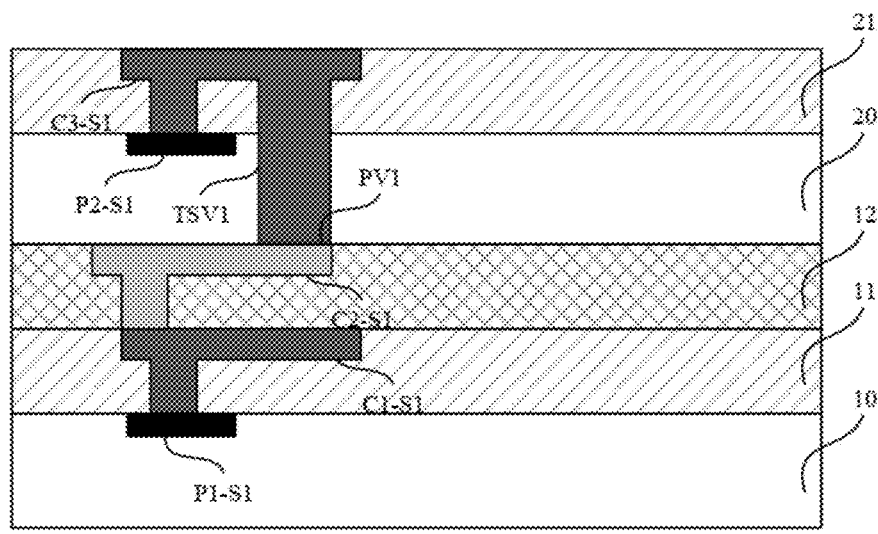
Figure 6F:
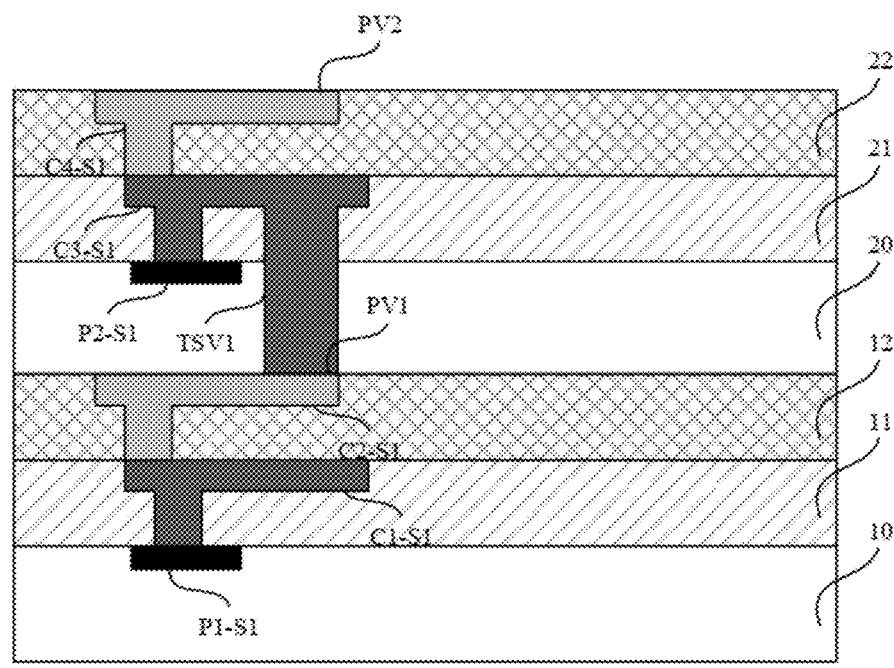

FIGS. 6E and 6F show schematic diagrams of step S110. A first medium material may be deposited on the second wafer 20, and a third wiring C3-S1 connected to the second bonding pad P2-S1 and the first landing pad PV1 may be fabricated to form a second lower RDL 21 (FIG. 6E). Thereafter, a second medium material may be deposited on the second lower RDL 21, and a fourth wiring C4-S1 and a second landing pad PV2 electrically connected to the third wiring C3-S1 may be fabricated to form a second upper RDL 22. The second medium material and the first medium material may be the same material or different materials. For example, they may be different oxides. It is to be noted that, before the deposition of the second lower RDL 21 and the second upper RDL 22, a process of performing the CMP on deposition positions may be further included (both the second wafer 20 and the second lower RDL 21 are subjected to the CMP).

Therefore, in this embodiment, the connection between a first TSV TSV1 and a bonding pad P1-S1 may be implemented via one lower RDL. That is, a signal of a first bonding pad P1-S1 may be guided out to a second wafer 20 without going through a micro bump, so that common problems associated with a wafer stacking process in the related art, such as material leakage, pseudo soldering and misalignment, may be prevented, and the adjustment on a position of a landing pad may be implemented via one upper RDL. Thus, more space may be provided for circuit design.

Figure 7A:
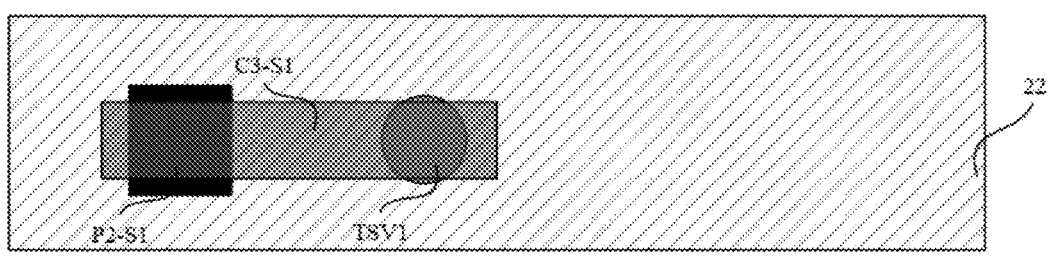
FIGS. 7A and 7B show top views of a wafer stacking structure shown in FIG. 6F.
Figure 7B:
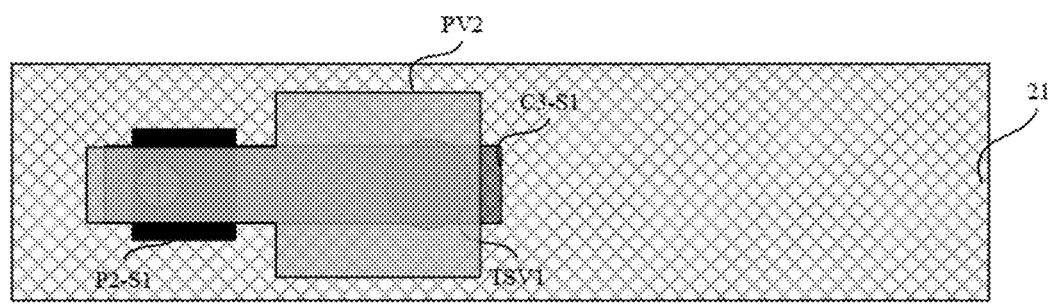

FIGS. 7A and 7B are top views of a second lower RDL 21 and a second upper RDL 22, respectively. With reference to FIGS. 7A, 7B and 6F, specific shape and size of each wiring on a same plane may be determined according to an actual requirement, and this invention is not limited in this regard.

In some embodiments, the die stacking structure may be fabricated with the following steps:

1. Sequentially fabricate a first lower RDL and a first upper RDL on a first wafer to guide out a signal of a first bonding pad to a first landing pad.
2. Bond a second wafer on the first upper RDL.
3. Deposit a first medium material on the second wafer.
4. Etch a through via at positions of the second wafer and the first medium corresponding to the first landing pad.
5. Etch a landing groove connected to the through via and the landing groove connected to a second bonding pad in the first medium material.
6. Fill a conductive material into the through via and the landing grooves to form a first TSV, a third wiring electrically connected to the first TSV and the second bonding pad, and a second lower RDL.
7. Perform CMP on the second lower RDL.
8. Deposit a second medium material on the second lower RDL.
9. Etch the landing groove on the second medium and fill the conductive material into the landing groove to form a fourth wiring electrically connected to the third wiring, a second landing pad and a second upper RDL.
10. Perform the CMP on the second upper RDL.

Figure 8:
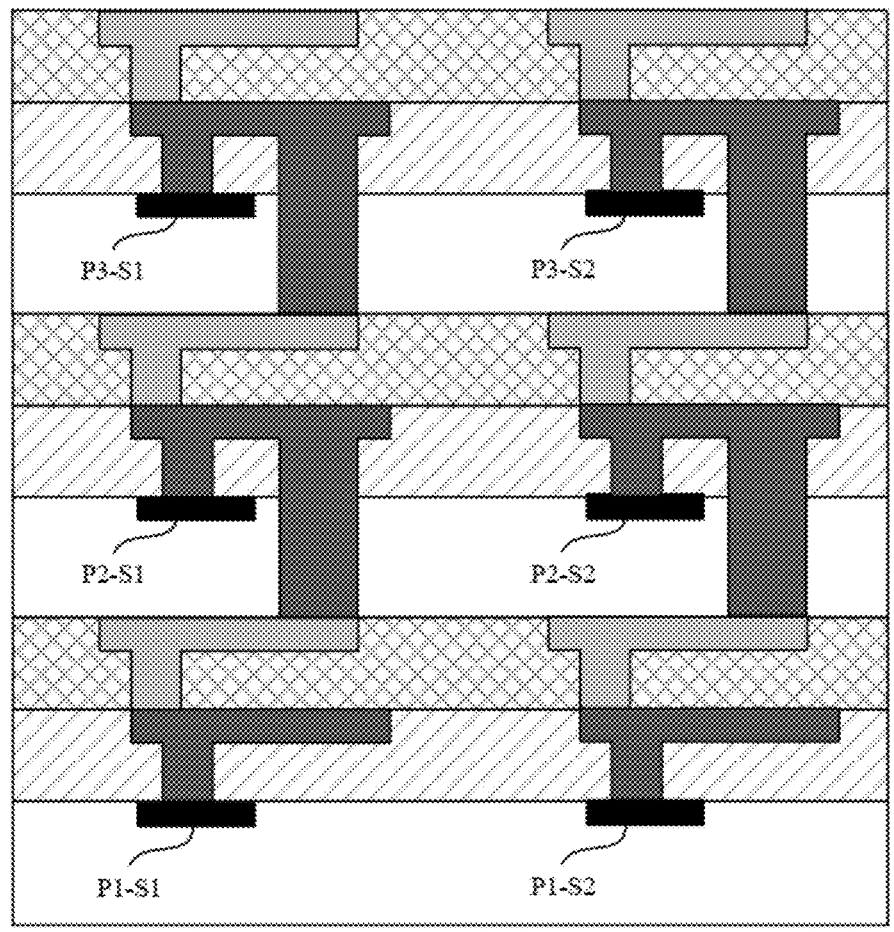
FIG. 8 shows a schematic diagram of a wafer stacking structure in accordance with one embodiment of the present invention.

It may be understood that a bonding pad connected to a same signal may be used as an example in this embodiment of the present invention for illustration, but in other embodiments, wafers on different layers may further be provided with a bonding pad connected to other signals, and the method and the structure provided by the present invention may be applicable provided that positions of the bonding pads connected to the same signal are corresponding in a vertical direction, as shown in FIG. 8.

In this embodiment of the present invention, wafers are first bonded before a TSV is fabricated, and bonding pads with a same relative position and a same connecting signal on each layer of wafer may be connected via one or two RDLs. Thus, the mechanical alignment and electrical connection of the TSV to a lower-layer signal may be implemented in one run. Since a micro bump is not necessary, common problems in the related art, which reduces production yield, may be effectively prevented, and the manufacturing cost may be lowered.

Figure 9:
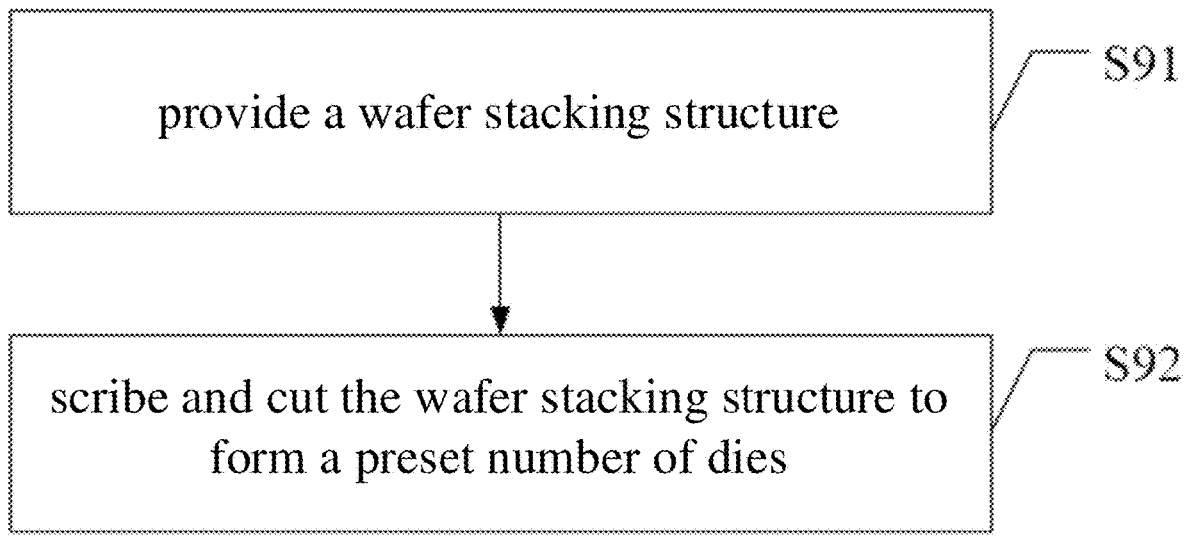
FIG. 9 shows a flowchart illustrating a die stacking method in accordance with one embodiment of the present invention.

FIG. 9 shows a schematic diagram of a die stacking method in accordance with one embodiment of the present invention.

Referring to FIG. 9, the die stacking method may include the following steps S91 and S92.

In step S91, a wafer stacking structure may be provided. The wafer stacking structure may be the wafer structure in any of the aforementioned embodiments.

In step S92, the wafer stacking structure may be scribed and cut to form a preset number of dies.

Figure 10:
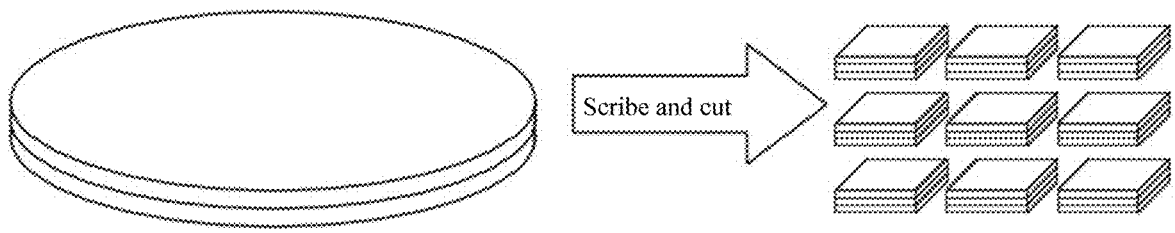
FIG. 10 shows a schematic diagram of a die stacking method shown in FIG. 9.

FIG. 10 shows a schematic diagram of a die stacking method in FIG. 9. With the method shown in FIG. 9, a die having a structure shown in the aforementioned embodiments, such as those shown in FIGS. 3E, 4, 6E, and 8, may be manufactured. Such a die is not provided with a micro bump structure, and the electrical connection is implemented between layers via an RDL and a TSV with a bottom directly connected to the RDL, so that the relatively high reliability is achieved, and common problems associated with a die in the related art, such as unstable electrical connection, may be prevented.

Figure 11:
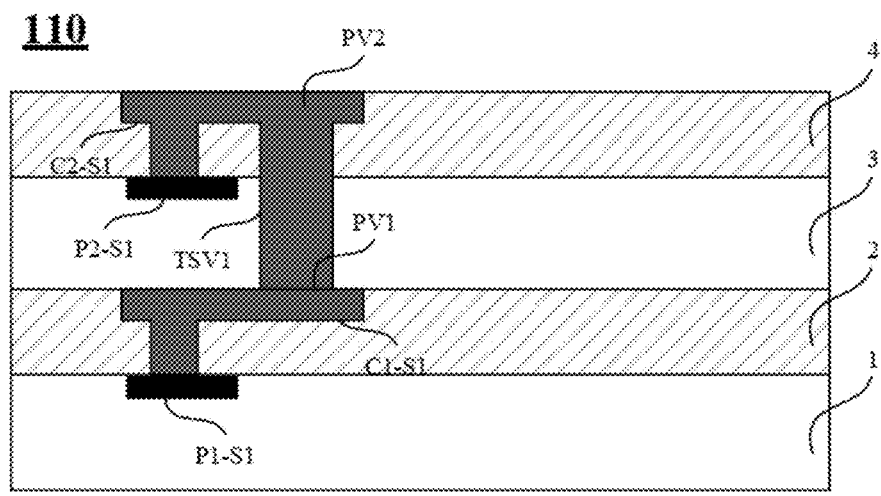
FIG. 11 shows a schematic diagram of a die stacking structure in accordance with one embodiment of the present invention.
Figure 12:
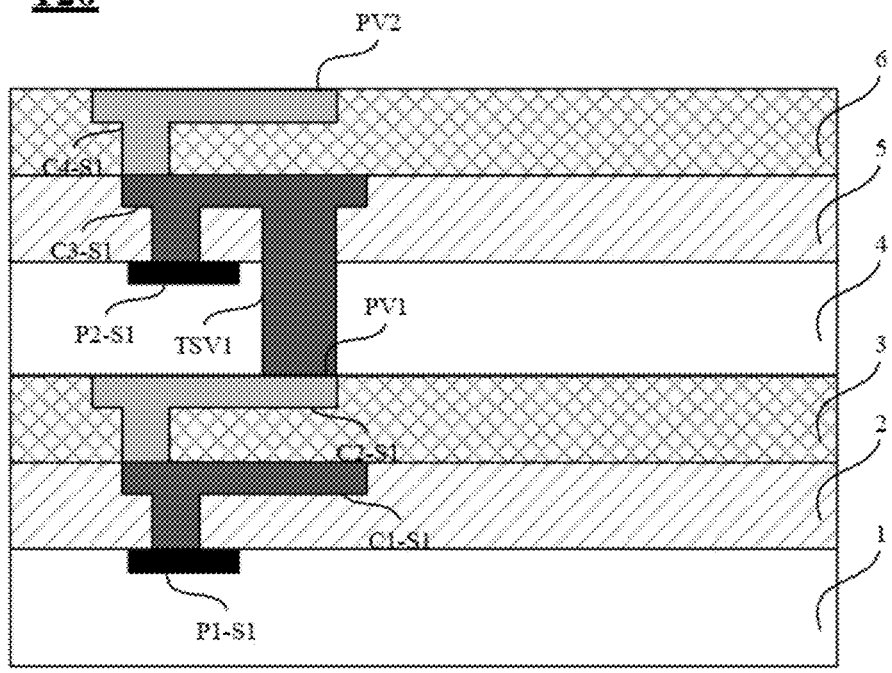
FIG. 12 shows a schematic diagram of a die stacking structure in accordance with one embodiment of the present invention.

FIGS. 11 and 12 show schematic diagrams of two die stacking structures.

Referring to FIG. 11, the die stacking structure 110 may include: a first die 1, having an upper surface including a first bonding pad P1-S1 configured to connect to a first signal S1; a first RDL 2, located on the first die 1 and including a first wiring C1-S1 electrically connected to the first bonding pad P1-S1, with the first wiring C1-S1 including a first landing pad PV1; a second die 3, having a bottom bonded on the first RDL 2, and an upper surface including a second bonding pad P2-S1 configured to connect to the first signal S1 and located corresponding to the first bonding pad P1-S1, and a TSV1 with a bottom electrically connected to the first landing pad PV1; and a second RDL 4, located on the second die 3, and including a second wiring C2-S1 electrically connected to the TSV1 and the second bonding pad P2-S1, the second wiring C2-S1 including a second landing pad PV2.

Referring to FIG. 12, the die stacking structure 120 may include: a first die 1, having an upper surface including a first bonding pad P1-S1 configured to connect to a first signal S1; a first lower RDL 2, located on the first die 1 and including a first wiring C1-S1 electrically connected to the first bonding pad P1-S1; a first upper RDL 3, located on the first lower RDL 2 and including a second wiring C2-S1 electrically connected to the first wiring C1-S1, with the second wiring C2-S1 including a first landing pad PV1; a second die 4, having a bottom bonded on the first upper RDL 3, and an upper surface provided with a second bonding pad P2-S1 connecting the first signal S1 and located corresponding to the first bonding pad P1-S1 and a TSV1 with a bottom electrically connected to the first landing pad PV1; a second lower RDL 5, located on the second die, and including a third wiring C3-S1 electrically connected to the second bonding pad P2-S1 and the TSV1; and a second upper RDL 6, located on the second lower RDL, and including a fourth wiring C4-S1 electrically connected to the third wiring C3-S1, with the fourth wiring C4-S1 including a second landing pad PV2.

Although FIGS. 11 and 12 illustrate a die stacking structure including only two layers of dies, it may be understood that the person skilled in the art may independently set the number of layers of stacked dies according to an actual demand and the above embodiments, which is not limited by the present invention thereto.

It is to be noted that the wafer stacking structure provided by the embodiments of the present invention may be fabricated by the wafer stacking method provided by the embodiments of the present invention.

In addition, the above accompanying drawings are merely schematic descriptions on processing included in the method according to the exemplary embodiment of the present invention and are not intended to limit the present invention. It is easily understood that the processing in the accompanying drawings does not indicate or limit a time sequence of these processing. Additionally, it is also easily understood that these processing may be, for example, executed in multiple modules synchronously or asynchronously.

Other embodiments of the present invention will be apparent to the person skilled in the art from consideration of the specification and practice of the present invention disclosed here. The present invention is intended to cover any variations, uses, or adaptations of the present invention following the general principles thereof and including such departures from the present invention as come within known or customary practice in the art. The specification and the embodiments are merely considered as being exemplary, and the real scope and concept of the present invention are subjected to the claims.

What is claimed is:

1. A wafer stacking method, comprising:
providing a first wafer, wherein an upper surface of the first wafer comprises a first bonding pad configured to connect to a first signal;
fabricating a first redistribution layer (RDL) on the first wafer, wherein the first RDL comprises a first wiring electrically connected to the first bonding pad, and the first wiring comprises a first landing pad;
bonding a second wafer on the first RDL, wherein the second wafer comprises a second bonding pad configured to connect to the first signal and is located corresponding to the first bonding pad;
fabricating, at a position of the second wafer corresponding to the first landing pad, a first through silicon via (TSV) with a bottom connected to the first landing pad; and
fabricating a second RDL on the second wafer to connect the second bonding pad and the first TSV, and to form a second landing pad.

2. The method of claim 1, wherein a distance between the first landing pad and the first bonding pad in a horizontal direction is larger than zero.

3. The wafer stacking method of claim 1, wherein fabricating a first TSV with a bottom connected to the first landing pad comprises:
fabricating, at the position of the second wafer corresponding to the first landing pad, a through via, wherein a bottom of the through via exposes the first landing pad; and
filling a conductive material into the through via, wherein the conductive material comprises a metal.

4. The wafer stacking method of claim 3, further comprising:
fabricating a groove configured to form the second RDL while fabricating the through via.

5. A wafer stacking structure, comprising:
a first wafer, having an upper surface comprising a first bonding pad configured to connect to a first signal;
a first redistribution layer (RDL), located on the first wafer and comprising a first wiring electrically connected to the first bonding pad, the first wiring comprising a first landing pad;
a second wafer, having a bottom bonded on the first RDL, and an upper surface comprising a second bonding pad configured to connect to the first signal and located corresponding to the first bonding pad, and a first through silicon via (TSV) with a bottom electrically connected to the first landing pad; and
a second RDL, located on the second wafer, and comprising a second wiring electrically connected to the first TSV and the second bonding pad, the second wiring comprising a second landing pad.

6. The wafer stacking structure of claim 5, wherein a distance between the first landing pad and the first bonding pad in a horizontal direction is larger than zero.

7. A die stacking method, comprising:
providing the wafer stacking structure of claim 5; and
scribing and cutting the wafer stacking structure to form a preset number of dies.

8. A die stacking structure, comprising:
a first die, having an upper surface comprising a first bonding pad configured to connect to a first signal;

a first redistribution layer (RDL), located on the first die and comprising a first wiring electrically connected to the first bonding pad, the first wiring comprising a first landing pad;
a second die, having a bottom bonded on the first RDL, and an upper surface comprising a second bonding pad configured to connect to the first signal and located corresponding to the first bonding pad, and a first through silicon via (TSV) with a bottom electrically connected to the first landing pad; and
a second RDL, located on the second die, and comprising a second wiring electrically connected to the first TSV and the second bonding pad, the second wiring comprising a second landing pad.

9. The die stacking structure of claim 8, wherein a distance between the first landing pad and the first bonding pad in a horizontal direction is larger than zero.

10. A wafer stacking method, comprising:
providing a first wafer, wherein the first wafer comprises a first bonding pad configured to connect to a first signal;
sequentially fabricating a first lower redistribution layer (RDL) and a first upper RDL on the first wafer, wherein the first lower RDL comprises a first wiring electrically connected to the first bonding pad, the first upper RDL comprises a second wiring electrically connected to the first wiring, and the second wiring comprises a first landing pad;
bonding a second wafer on the first upper RDL, wherein the second wafer comprises a second bonding pad configured to connect to the first signal and located corresponding to the first bonding pad;
fabricating, at a position of the second wafer corresponding to the first landing pad, a first through silicon via (TSV) with a bottom connected to the first landing pad; and
fabricating two RDLs on the second wafer to connect the second bonding pad and the first TSV, and to form a second landing pad.

11. The wafer stacking method of claim 10, wherein a distance between the first landing pad and the first bonding pad in a horizontal direction is larger than zero.

12. The wafer stacking method of claim 10, wherein fabricating a first TSV with a bottom connected to the first landing pad comprises:
fabricating, at the position of the second wafer corresponding to the first landing pad, a through via, wherein a bottom of the through via exposes the first landing pad; and
filling a conductive material into the through via, wherein the conductive material comprises a metal.

13. The wafer stacking method of claim 12, further comprising:
fabricating a groove configured to form a second lower RDL while fabricating the through via.

14. The wafer stacking method of claim 10, wherein fabricating two RDLs on the second wafer to connect the second bonding pad and the first TSV, and to form a second landing pad comprises:
fabricating a second lower RDL on the second wafer, wherein the second lower RDL comprises a third wiring electrically connected to the first TSV and the second bonding pad; and
fabricating a second upper RDL on the second lower RDL, wherein the second upper RDL comprises a fourth wiring electrically connected to the third wiring, and the fourth wiring comprises the second landing pad.

15. A wafer stacking structure, comprising:
a first wafer, having an upper surface comprising a first bonding pad configured to connect to a first signal;
a first lower redistribution layer (RDL), located on the first wafer and comprising a first wiring electrically connected to the first bonding pad;
a first upper RDL, located on the first lower RDL and comprising a second wiring electrically connected to the first wiring, the second wiring comprising a first landing pad;
a second wafer, having a bottom bonded on the first upper RDL, and an upper surface provided with a second bonding pad connecting to the first signal and located corresponding to the first bonding pad, and a first through silicon via (TSV) with a bottom electrically connected to the first landing pad;
a second lower RDL, located on the second wafer, and comprising a third wiring electrically connected to the second bonding pad and the first TSV; and
a second upper RDL, located on the second lower RDL, and comprising a fourth wiring electrically connected to the third wiring, the fourth wiring comprising a second landing pad.

16. The wafer stacking structure of claim 15, wherein a distance between the first landing pad and the first bonding pad in a horizontal direction is larger than zero.

17. A die stacking method, comprising:
providing the wafer stacking structure of claim 15; and
scribing and cutting the wafer stacking structure to form a preset number of dies.

18. A die stacking structure, comprising:
a first die, having an upper surface comprising a first bonding pad configured to connect to a first signal;
a first lower redistribution layer (RDL), located on the first die and comprising a first wiring electrically connected to the first bonding pad;
a first upper RDL, located on the first lower RDL and comprising a second wiring electrically connected to the first wiring, the second wiring comprising a first landing pad;
a second die, having a bottom bonded on the first upper RDL, and an upper surface provided with a second bonding pad connecting the first signal and located corresponding to the first bonding pad, and a first through silicon via (TSV) with a bottom electrically connected to the first landing pad;
a second lower RDL, located on the second die, and comprising a third wiring electrically connected to the second bonding pad and the first TSV; and
a second upper RDL, located on the second lower RDL, and comprising a fourth wiring electrically connected to the third wiring, the fourth wiring comprising a second landing pad.

19. The die stacking structure of claim 18, wherein a distance between the first landing pad and the first bonding pad is larger than zero.

20. A die stacking structure, comprising:
a plurality of die structures stacked over one another, wherein each of the plurality of die structures comprises:
a die, having an upper surface comprising a bonding pad configured to connected to a signal;

a lower redistribution layer (RDL), located on the die and comprising a first wiring electrically connected to the bonding pad; and an upper RDL, located on the lower RDL and comprising a second wiring electrically connected to the first wiring, the second wiring having a landing pad, wherein in each of the plurality of die structures except for the bottom most die structure, the die is bonded to the upper RDL of the die structure underneath, and comprises a through silicon via (TSV) with a bottom electrically connected to the landing pad of the die structure underneath, and the first wiring in the lower RDL is electrically connected to the TSV, wherein bonding pads of the plurality of die structures are located on corresponding locations, and wherein the signals in the die of each of the plurality of die structures are guided out to the landing pad of the uppermost die structure through the TSVs in the plurality of die structures.

* * * * *